(12) United States Patent
Kim et al.

(10) Patent No.: US 7,176,503 B2
(45) Date of Patent: Feb. 13, 2007

(54) LIGHT EMITTING DIODE PACKAGE AND LIGHT SOURCE COMPRISING THE SAME

(75) Inventors: Hyung Suk Kim, Suwon (KR); Young Sam Park, Seoul (KR); Hun Joo Hahm, Sungnam (KR); Jung Kyu Park, Suwon (KR); Young June Jeong, Suwon (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/967,212

(22) Filed: Oct. 19, 2004

(65) Prior Publication Data

US 2006/0006406 A1    Jan. 12, 2006

(30) Foreign Application Priority Data

Jul. 2, 2004    (KR) ...................... 10-2004-0051428

(51) Int. Cl.
*H01L 29/24* (2006.01)
*H01L 31/12* (2006.01)

(52) U.S. Cl. .................. 257/100; 257/80; 257/86; 257/89; 257/84; 257/99; 257/E33.056

(58) Field of Classification Search .................. 257/80, 257/88, 89, 84, 99, 100, E33.056; 313/498–500
See application file for complete search history.

(56) References Cited

U.S. PATENT DOCUMENTS

| | | | |
|---|---|---|---|
| 6,377,292 B1 * | 4/2002 | Shimizu et al. .............. 347/238 |
| 2002/0158261 A1 * | 10/2002 | Lee et al. ...................... 257/88 |
| 2002/0159002 A1 | 10/2002 | Chang | |
| 2003/0042844 A1 * | 3/2003 | Matsumura et al. ........ 313/498 |
| 2003/0160255 A1 * | 8/2003 | Taninaka et al. .............. 257/88 |
| 2003/0178627 A1 | 9/2003 | Marchl et al. | |

* cited by examiner

*Primary Examiner*—Kenneth Parker
*Assistant Examiner*—Joseph Nguyen
(74) *Attorney, Agent, or Firm*—Lowe, Hauptman & Berner, LLP.

(57) ABSTRACT

An LED package comprises a substrate, one or three terminals formed on a first side of the substrate, three terminals formed on a second side opposite to the first side, and two or three LEDs disposed on the substrate, one of the LEDS being electrically connected to one of the terminals formed on the first side while being electrically connected to one of the terminals formed on the second side, and other LEDS being electrically connected to two terminals formed on the first side or to two terminals formed on the second side. A light source comprises the LED packages having the structure as described above. Without being arranged in a line, the LEDs emitting the same color are differently arranged in every LED package, thereby solving the problem of non-uniform combination of the colors according to the positions of the LEDs on an LED package-mounting substrate.

13 Claims, 6 Drawing Sheets

LIGHT EMITTING DIODE PACKAGE AND LIGHT SOURCE COMPRISING THE SAME

RELATED APPLICATIONS

The present application is based on, and claims priority from, Korean Application Number 2004-51428, filed Jul. 2, 2004, the disclosure of which is hereby incorporated by reference herein in the entirety.

BACKGROUND OF THE INVENTION

1. Field of the Invention

The present invention relates to an LED (Light Emitting Diode) package, and a light source using the LED package, and more particularly to an LED package, which has a plurality of LEDs emitting different colors arranged differently in every LED package, and which is mounted on an LED package-mounting substrate with predetermined patterns formed thereon such that the LEDs emitting the same color in several LED packages are connected in series, thereby allowing adjustment of intensity of respective colors and smooth combinations of the colors, and a light source using the LED package.

2. Description of the Related Art

Recently, a nitride semiconductor using a nitride, such as gallium nitride (GaN), has been in the spotlight as an essential material for a photoelectric material or an electronic device due to its excellent physical and chemical properties. In particular, a nitride semiconductor light emitting device can generate light having wavelengths of green, blue and UV light, and with a rapid enhancement of brightness by technological development, it also has many applications in several fields, such as a full color video display board, an illuminating apparatus, etc.

Figure 1A:
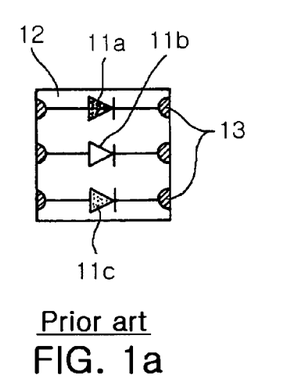
FIGS. 1a to 1c are diagrams illustrating an LED package, an LED package-mounting substrate, and a light source according to the prior art.
Figure 1B:
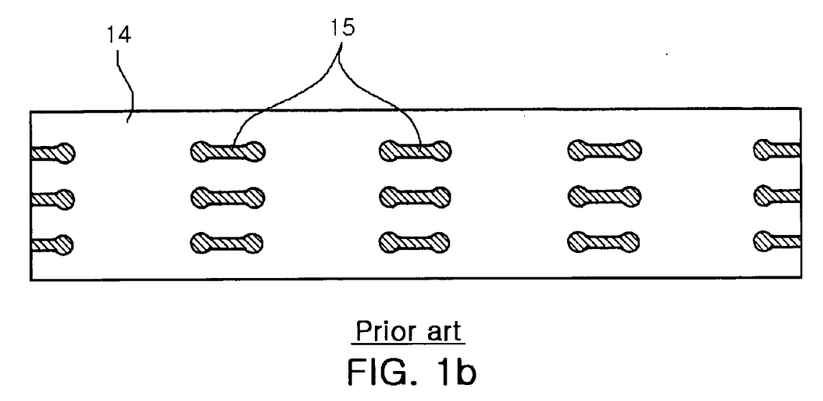
Figure 1C:
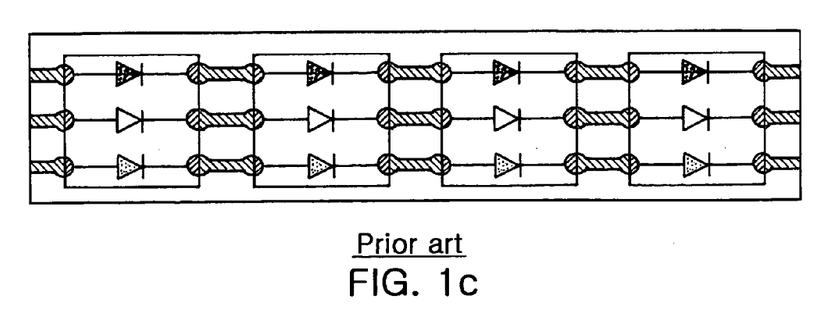

Particularly, in the field of LCD panels, in pursuant to weight reduction and miniaturization, investigations have been actively undertaken, particularly on utility of LEDs as a light source for a backlight of an LCD panel. Generally, the LCD panel used in an LED monitor is of a side emitting type, and requires a linear light source. FIGS. 1a to 1c show an example of the linear light source using conventional LEDs.

First, as shown in FIG. 1a, in order to produce LED packages, a red LED 11a, a green LED 11b and a blue LED 11c for generating white light are disposed in parallel on a substrate 12, and connected to terminals 13. After producing the LED packages, an LED package-mounting substrate 14 is produced. Here, as shown in FIG. 1b, the LED package-mounting substrate 14 is formed with conductive patterns 15 for connecting the terminals of the LED packages. Finally, as shown in FIG. 1c, the LED packages as shown in FIG. 1a are mounted in a line on the LED package-mounting substrate 14 as shown in FIG. 1b, thereby providing the linear light source.

Such a light source using the conventional LEDs has a structure wherein the LEDs emitting respective colors are in series connection to each other on the LED package-mounting substrate 14, as shown in FIG. 1c. The reason for the series connection of the LEDs emitting the same color is to match color coordinates in order so that the intensity of respective colors can be adjusted by controlling power supplied to the LEDs to generate high quality white light. However, in the conventional light source, since the LEDs emitting the same color are arranged in a line, causing differences in combination of the colors according to positions thereof on the LED package-mounting substrate, it is difficult to obtain a uniform white light. For instance, red light is emitted stronger adjacent to a position where the red LEDs are connected in a line, and blue light is emitted stronger adjacent to a position where the blue LEDs are connected in a line. Particularly, since an Al PCB recently used as the LED package-mounting substrate has the structure of a single surface substrate wherein a dielectric layer is formed on an Al layer and a conductive pattern is formed on the dielectric layer, the conductive pattern cannot be formed on the back side of the Al PCB, and thus, it is very difficult to change the arrangement of the LEDs while maintaining the width of the LED package-mounting substrate.

Accordingly, there is a need to provide a light source using a newly developed LED package, which allows smooth combination of the colors without increasing the width of the LED package-mounting substrate, thereby generating high quality white light.

SUMMARY OF THE INVENTION

The present invention has been made to solve the above problems, and it is an object of the present invention to provide an LED package, and a light source using the LED package, which allows LEDs emitting different colors to be disposed in different positions on an LED package-mounting substrate without increasing the width of the LED package-mounting substrate, thereby realizing miniaturization and reduction in thickness of a display apparatus.

In accordance with one aspect of the present invention, the above and other objects can be accomplished by the provision of an LED package, comprising: a substrate; one or three terminals formed on a first side of the substrate; three terminals formed on a second side opposite to the first side; and two or three LEDs (Light Emitting Devices) disposed on the substrate, one of the LEDs being electrically connected to one of the terminals formed on the first side and electrically connected to one of the terminals formed on the second side, and other LEDs being electrically connected to two terminals formed on the first side or to two terminals formed on the second side.

In the LED package of the present invention, the one or three terminals may comprise first, second and third terminals sequentially formed on the first side of the substrate; and the three terminals may comprise fourth, fifth and sixth terminals sequentially formed on the second side opposite to the first side, and the LEDs may comprise a first LED electrically connected to the first and sixth terminals and disposed at the center of the substrate; a second LED electrically connected to the second and third terminals and disposed between the first side and the first LED; and a third LED electrically connected to the fourth and fifth terminals and disposed between the second side and the first LED. The three LEDs may comprise a red LED, a green LED, and a blue LED.

In the LED package of the invention, the one or three terminals may comprise a first terminal formed on the first side of the substrate; and the three terminals may comprise second, third and fourth terminals sequentially formed on the second side opposite to the first side; and the LEDs may comprise a first LED electrically connected to the first and fourth terminals; and a second LED electrically connected to the second and third terminals and disposed between the second side and the first LED. The two LEDs may comprise LEDs generating complementary colors.

In accordance with another aspect of the present invention, there is provided a light source, comprising: a plurality of LED packages, each including: a substrate; first, second and third terminals sequentially formed on a first side of the substrate; fourth, fifth and sixth terminals sequentially formed on a second side opposite to the first side; an LED electrically connected to the first and sixth terminals; another LED electrically connected to the second and third terminals; and a third LED electrically connected to the fourth and fifth terminals; and an LED package-mounting substrate, the LED package-mounting substrate mounting the plurality of LED packages in series thereon in a direction of the terminals and being formed with a plurality of terminal contact patterns contacting the terminals of the plurality of LEDs and a plurality of connecting patterns to connect the terminal contact pattern contacting the first terminal and the fourth terminal of each LED package to the terminal contact pattern contacting the third terminal and the sixth terminal of adjacent LED package, and to connect the terminal contact pattern contacting the second terminal of the LED package to the terminal contact pattern contacting the fifth terminal of another adjacent LED package.

In the light source of the invention, the plurality of LED packages may comprise: a first LED package including a first LED electrically connected to the first and sixth terminals and disposed at the center of the first LED package, a second LED electrically connected to the second and third terminals and disposed between the first side and the first LED, and a third LED electrically connected to the fourth and fifth terminals and disposed between the first LED and the second side; a third LED package mounted on the substrate adjacent to one side of the first LED package, and including a third LED electrically connected to the first and sixth terminals and disposed at the center of the second LED package, a first LED electrically connected to the second and third terminals and disposed between the third LED and the first side, and a second LED electrically connected to the fourth and fifth terminals and disposed between the third LED and the second side; and a second LED package mounted on the substrate at the other side of the first LED package, and including a second LED electrically connected to the first and sixth terminals and disposed at the center of the second LED package, a third LED electrically connected to the second and third terminals and disposed between the second LED and the first side, and a first LED electrically connected to the fourth and fifth terminals and disposed between the second LED and the second side, and the second LED package, the first LED package and the third package being repetitiously mounted on the LED package-mounting substrate in this order. The first LED may be a red LED, the second LED may be a green LED, and the third LED may be a blue LED. Particularly, the LED package-mounting substrate may be an Al PCB.

In accordance with yet another aspect of the present invention, there is provided a light source, comprising: a plurality of LED packages, each including: a substrate; a first terminal formed on a first side of the substrate; second, third and fourth terminals formed on a second side opposite to the first side; an LED electrically connected to the first and sixth terminals; and another LED electrically connected to the second and third terminals; and an LED package-mounting substrate, the LED package-mounting substrate mounting the plurality of LED packages in series thereon in a direction of the terminals and being formed with a plurality of terminal contact patterns contacting the terminals of the plurality of LEDs and a plurality of connecting patterns to connect the terminal contact pattern contacting the first terminal of each LED package to the terminal contact pattern contacting the third terminal of adjacent LED package, and to connect the terminal contact pattern contacting the second terminal of the LED package to the terminal contact pattern contacting the fourth terminal of another adjacent LED package.

In the light source of the invention, the plurality of LED packages may comprise: a first LED package including a first LED electrically connected to the first and fourth terminals and disposed adjacent to the first side of the first LED package and a second LED electrically connected to the second and third terminals and disposed adjacent to the second side; a second LED package mounted on the substrate adjacent to one side of the first LED package, and including a second LED electrically connected to the first and fourth terminals and disposed adjacent to the first side of the first LED package and a first LED electrically connected to the second and third terminals and disposed adjacent to the second side, the first LED package and the second being repetitiously mounted on the LED package-mounting substrate in this order. The first LED and the second LED may be LEDs generating complementary colors. Particularly, the LED package-mounting substrate may be an Al PCB.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED
EMBODIMENTS

Preferred embodiments will now be described in detail with reference to the accompanying drawings.

Figure 2A:
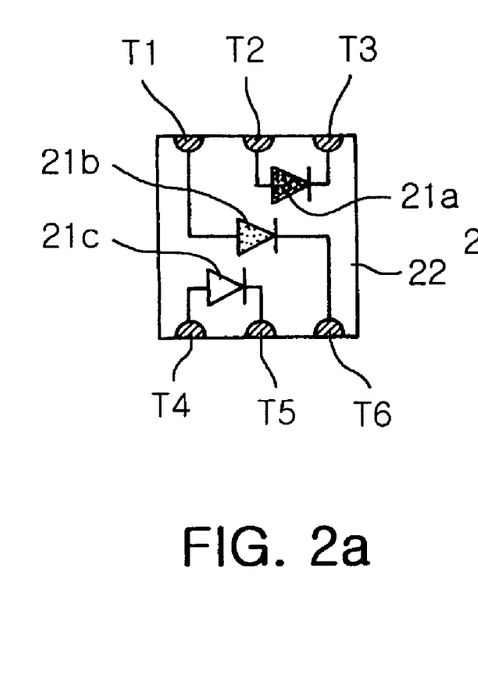
FIGS. 2a to 2c are circuit diagrams illustrating an LED package according to one embodiment of the present invention.
Figures 2B, 2C:
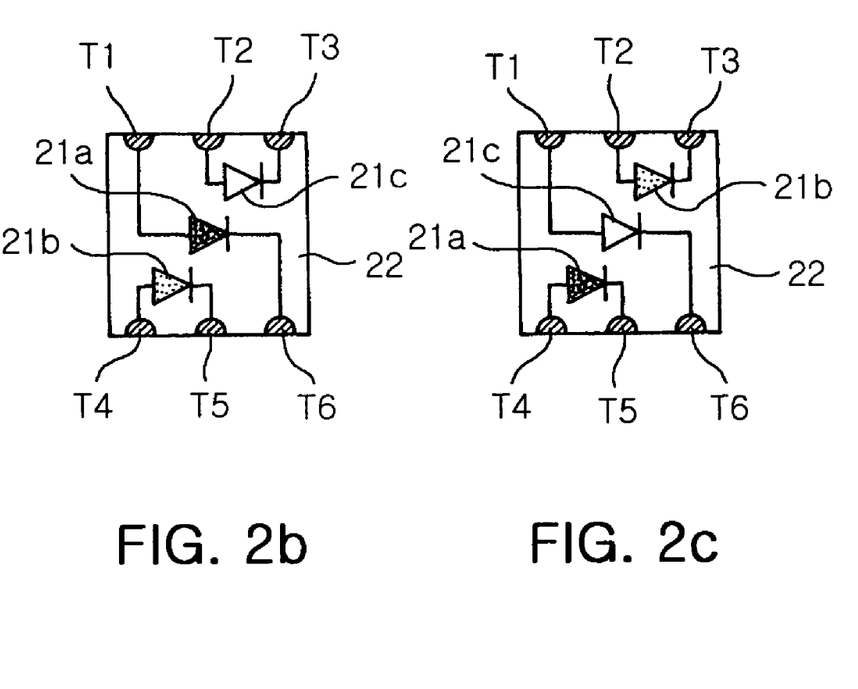

FIGS. 2a to 2c are circuit diagrams illustrating an LED package according to one embodiment of the present invention. Referring to FIGS. 2a to 2c, the LED package according to the present invention comprises a substrate 22, one or three terminals T1 to T2 formed on a first side of the substrate 22, three terminals T4 to T6 formed on a second side opposite to the first side; and two or three LEDs 21a, 21b and 21c disposed on the substrate 22. Here, one of the LEDs 21a, 21b and 21c is electrically connected to the terminal T1 among the terminals formed on the first side and to the terminal T6 among the terminals formed on the second side, and other LEDs are electrically connected to terminals T2 and T3 formed on the first side or to T4 and T5 formed on the second side, respectively. The LED packages shown in FIGS. 2a and 2b are the case where three LEDs are disposed on the substrate.

As shown in FIG. 2a, the LED package including the three LEDs may comprise: first, second and third terminals T1, T2 and T3 sequentially formed on the first side of the substrate 22; fourth, fifth and sixth terminals T4, T5 and T6 sequentially formed on the second side opposite to the first side; a first LED 21b electrically connected to the first and sixth terminals T1 and T6 and disposed at the center of the substrate 22; a second LED 21a electrically connected to the second and third terminals T2 and T3 and disposed between the first side and the first LED 21b; and a third LED 21c electrically connected to the fourth and fifth terminals T4 and T5 and disposed between the second side and the first LED 21b. In a case where above LED packages are used in a light source for generating white light, it is preferable that the three LEDs comprise a red LED, a green LED, and a blue LED.

Arrangement of the LEDs may be changed as shown in FIGS. 2b and 2c. Particularly, if the LED packages shown in FIGS. 2a, 2b and 2c are arranged in a direction of the terminals, the arrangement of the LEDs may be sequentially changed in their positions. For instance, when the first LED 21b is the green LED, the second LED 21a is the red LED, and the third LED 21c is the blue LED, the LED package shown in FIG. 2a has the arrangement of red, green, and bluecolors, the LED package shown in FIG. 2b has the arrangement of blue, green and red colors, and the LED package shown in FIG. 2c has the arrangement of green, blue and red colors. As such, the LED packages having different arrangements of LEDs are disposed and the LEDs emitting the same color are then electrically connected, providing a zigzag-shaped arrangement of the LEDs emitting the same color. Accordingly, non-uniform combination of the colors of the conventional light source can be overcome when generating white light.

Figure 3:
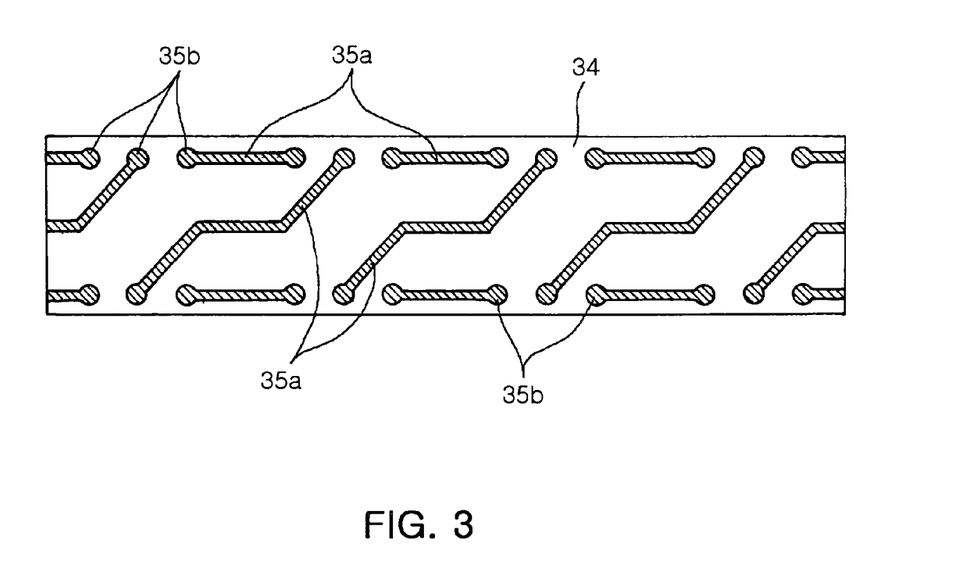
FIG. 3 is a plan view illustrating an LED package-mounting substrate according to one embodiment of the present invention.

FIG. 3 shows an LED package-mounting substrate mounting the LED packages such that the LEDs emitting the same colors in every LED package are in series connection to each other on the LED package-mounting substrate. Referring to FIG. 3, an LED package-mounting substrate 34 shown in FIGS. 2a to 2c is formed thereon with a plurality of terminal contact patterns 35b contacting the terminals of the plurality of LEDs, and a plurality of connecting patterns 35a to connect the terminal contact patterns contacting the first terminal and the fourth terminal of each LED package to the terminal contact patterns contacting the third terminal and the sixth terminal of adjacent LED package, and to connect the terminal contact pattern contacting the second terminal of the LED package to the terminal contact pattern contacting the fifth terminal of another adjacent LED package.

When the plurality of LED packages shown in FIGS. 2a to 2c are disposed in a line on the LED package-mounting substrate 34, a bar-shaped linear light source can be produced. In connection with this, recently, an Al PCB (Printed Circuit Board) with a high heat sink effect has been widely used. The Al PCB is produced by forming a dielectric layer on an Al layer acting as a conductor, followed by forming conductive patterns on the dielectric layer. Since a lower side of the Al PCB consists of the Al layer, the conductive patterns cannot be formed on the backside of the Al PCB. That is, the Al PCB has a limitation in utility of space since every conductive pattern should be formed on the upper surface thereof. Furthermore, the linear light source applicable to the field of LCD panels has a limitation in the width of the Al PCB. Accordingly, when using the Al PCB under the limitation in width of the Al PCB, mounting the LED packages on the LED package-mounting substrate according to the present invention, as described above, can provide an excellent linear light source overcoming such a limitation. Connections between the LED packages and the LED package-mounting substrate will be more apparently understood with reference to FIG. 4.

Figure 4:
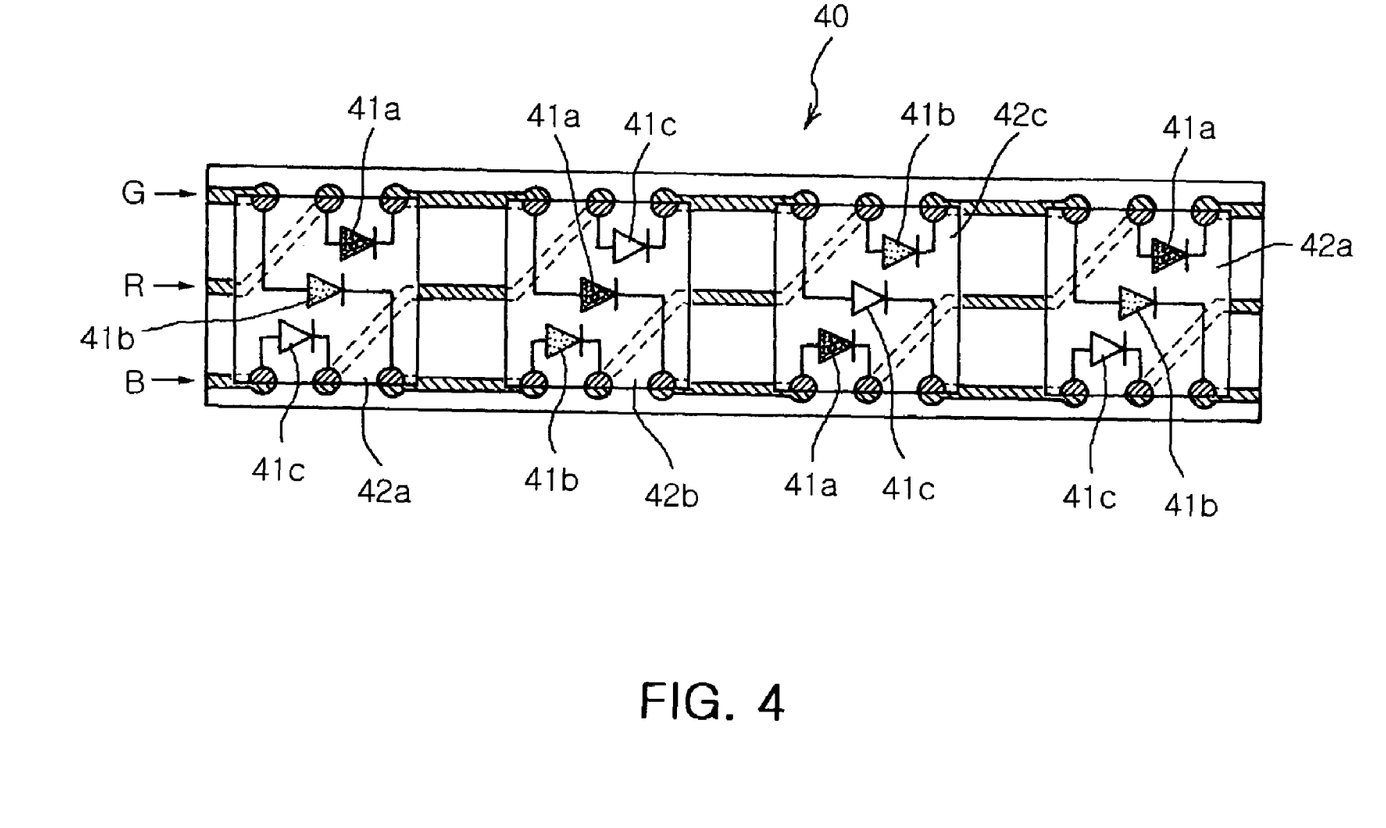
FIG. 4 is a plan view illustrating a light source having the LED packages according to one embodiment of the present invention.

FIG. 4 shows an example of a light source produced by mounting the LED packages shown in FIGS. 2a to 2c on the LED package-mounting substrate shown in FIG. 3. Referring to FIG. 4, a light source 40 of one embodiment of the invention includes a plurality of LED packages 42a, 42b and 42c, each of which comprises: a substrate; first, second and third terminals sequentially formed on a first side of the substrate; fourth, fifth and sixth terminals sequentially formed on a second side opposite to the first side; an LED electrically connected to the first and sixth terminals; another LED electrically connected to the second and third terminals; and a third LED electrically connected to the fourth and fifth terminals, and an LED package-mounting substrate, which mounts the plurality of LED packages 42a, 42b and 42c in a line thereon in a direction of the terminals. Here, the LED package-mounting substrate is formed thereon with a plurality of terminal contact patterns contacting the terminals of the plurality of LEDs, and a plurality of connecting patterns to connect the terminal contact pattern contacting the first terminal and the fourth terminal of each LED package to the terminal contact pattern contacting the third terminal and the sixth terminal of the adjacent LED package, and to connect the terminal contact pattern contacting the second terminal of the LED package to the terminal contact pattern contacting the fifth terminal of the other adjacent LED package.

Particularly, in the light source 40, the first to third LED packages having different arrangement of the LEDs are repetitiously mounted on the LED package-mounting substrate in a predetermined order.

Among the plurality of LED packages, a first LED package 42b includes a first LED 41a electrically connected to the first and sixth terminals and disposed at the center of the first LED package 42b, a second LED 41c electrically connected to the second and third terminals and disposed between the first side and the first LED 41a, and a third LED 41b electrically connected to the fourth and fifth terminals and disposed between the first LED 41a and the second side.

A second LED package 42a is mounted adjacent to one side of the first LED package 42b, and includes a third LED 41b electrically connected to the first and sixth terminals and disposed at the center of the second LED package 42a, a first LED 41a electrically connected to the second and third terminals and disposed between the third LED 41b and the first side, and a second LED 41c electrically connected to the fourth and fifth terminals and disposed between the third LED 41b and the second side.

A third LED package 42c is mounted at the other side of the first LED package 42b, and includes a second LED 41c electrically connected to the first and sixth terminals and disposed at the center of the third LED package, a third LED 41b electrically connected to the second and third terminals and disposed between the second LED 41c and the first side, and a first LED 41a electrically connected to the fourth and fifth terminals and disposed between the second LED 41c and the second side.

In FIG. 4, in terms of the electrical connection indicated by the arrow G, it can be appreciated that the third LED 41*b* of the second LED package 42*a*, the third LED 41*b* of the first LED package 42*b*, and the third LED 41*b* of the third LED package 42*c* are connected in series. Furthermore, in terms of the electrical connection indicated by the arrow R, it can be appreciated that the first LEDs 41*a* of the respective LED packages 42*a*, 42*b*, and 42*c* are connected in series, and in terms of the electrical connection indicated by the arrow B, it can be appreciated that the second LEDs 41*c* of the respective LED packages 42*a*, 42*b*, and 42*c* are connected in series.

As such, in the light source of the present invention, the LEDs emitting the same color and differently positioned in the respective LED packages can be connected in series by the conductive patterns formed on the LED mounting-substrate 44. Accordingly, unlike the conventional light source which has the LEDs emitting the same color arranged in a line, the LEDs emitting the same color can be connected to each other in series, so that power supplied to the LEDs emitting respective colors can be controlled and, at the same time, the combination of the colors can be effectively performed, thereby generating white light of a high quality having a uniform color tone.

Figure 5A:
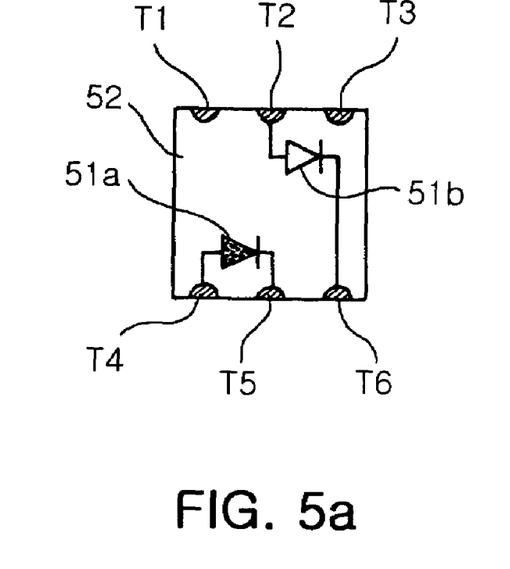
FIGS. 5a and 5b are circuit diagrams illustrating an LED package according to another embodiment of the present invention.

FIGS. 5*a* and 5*b* are circuit diagrams illustrating an LED package according to another embodiment of the present invention. Unlike the LED package using the three LEDs, the LED package shown in FIG. 5*a* employs two LEDs. The LED package including the two LEDs according to the embodiment of the invention may comprise a first terminal T2 formed on a first side of a substrate 52; second, third and fourth terminals T4, T5 and T6 sequentially formed on a second side of the substrate 52; a first LED 51*b* electrically connected to the first and fourth terminals T2 and T6; a second LED 51*a* electrically connected to the second and third terminals T4 and T5 and disposed between the second side and the first LED 51*b*. When the LED package according to the embodiment as set forth above is used in a light source for generating white light it is preferable that the two LEDs comprise LEDs emitting complementary colors.

Figure 5B:
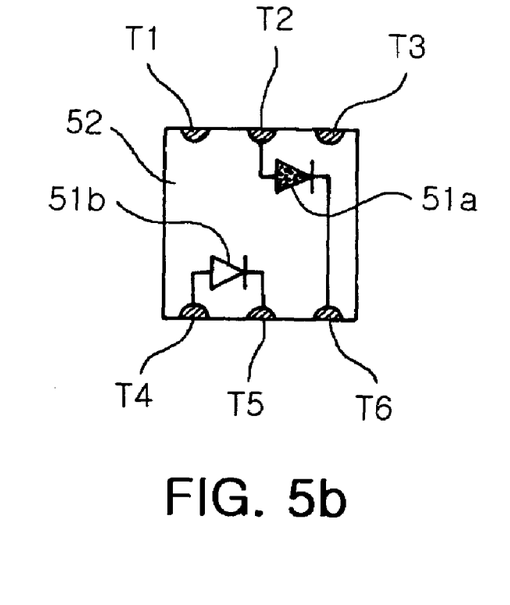

Arrangement of the LEDs may be changed as shown in FIG. 5*b*. Particularly, if the LED packages shown in FIGS. 5*a* and 5*b* are arranged in a direction of the terminals, the arrangement of the LEDs may be sequentially changed. For instance, when the first LED 51*b* is a yellow LED and the second LED 51*a* is a blue LED, the LED package shown in FIG. 5*a* has the arrangement of yellow and blue colors, and the LED package shown in FIG. 5*b* has the arrangement of blue and yellow colors. As such, the LED packages having different arrangements of LEDs are disposed on an LED package-mounting substrate, and the LEDs emitting the same color are then electrically connected, thereby providing a zigzag-shaped arrangement of the LEDs emitting the same color. Accordingly, the non-uniform combination of the colors of the prior art can be overcome when generating white light.

In FIGS. 5*a* and 5*b*, it is shown that two terminals T1 and T3 are not connected to the LED at the first side on the LED package-mounting substrate. In connection with this, it should be noted that the LED package-mounting substrate formed with terminals used for the three LEDs as shown in FIG. 3 is also applicable to this embodiment. That is, since the LED package-mounting substrate formed with terminals used for the three LEDs can be compatibly used without additionally manufacturing the LED package-mounting substrate formed with terminals used for the two LEDs, manufacturing costs for additional LED package-mounting substrate are not required. Furthermore, without additionally manufacturing the LED package-mounting substrate formed with terminals used for the two LEDs, the LED package-mounting substrate formed with terminals used for the three LEDs can be used. This will be more apparently understood in FIG. 6.

Figure 6:
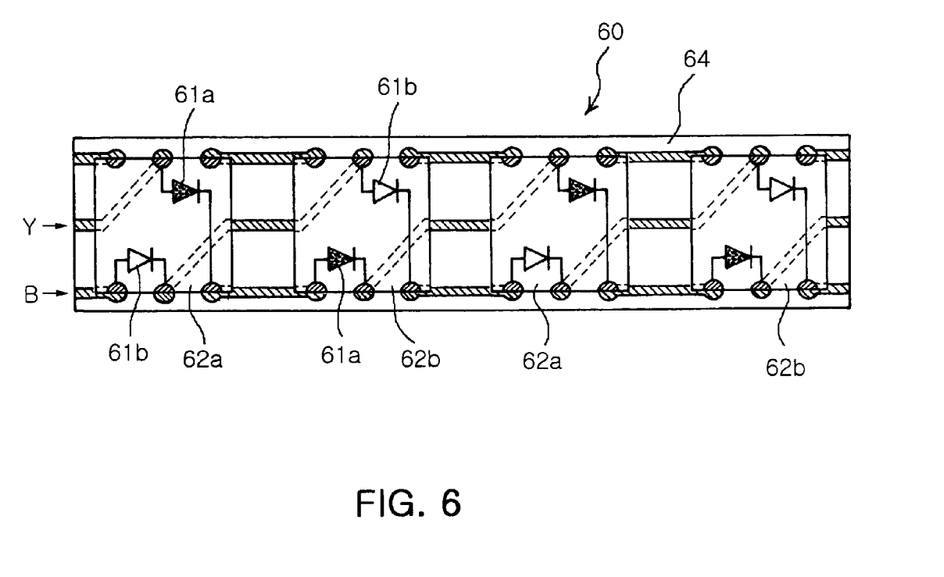
FIG. 6 is a plan view illustrating a light source using the LED packages according to another embodiment of the present invention.

FIG. 6 shows an example of a light source produced using the LED package shown in FIGS. 5*a* and 5*b*, and the LED package-mounting substrate shown in FIG. 3. Referring to FIG. 6, a first LED package 62*a* comprises a first LED 61*a* electrically connected to the first and fourth terminals and disposed adjacent to the first side of the first LED package, and a second LED 61*b* electrically connected to the second and third terminals and disposed adjacent to the second side.

A second LED package 62*b* is mounted on the LED package-mounting substrate adjacent to one side of the first LED package 62*a*. The second LED package 62*b* comprises a second LED 61*b* electrically connected to the first and fourth terminals and disposed adjacent to a first side of the second LED package 62*b*, and a first LED 61*a* electrically connected to the second and third terminals and disposed adjacent to a second side of the second LED package 62*b*.

As shown in FIG. 6, the first LED package and the second LED package may be repetitiously mounted on the LED package-mounting substrate in this order. With this arrangement, the non-uniform combination of the colors in the conventional light unit, which arranges the LEDs emitting the same color in a line, can be prevented. According to this embodiment, it is desirable that the first LED 61*a* and the second LED 61*b* be LEDs generating complementary colors.

In FIG. 6, in terms of the electrical connection indicated by the arrow Y, it can be appreciated that the first LED 61*a* of the first LED package 62*a* and the first LED 61*a* of the second LED package 62*b* are connected in series. Likewise, in terms of the electrical connection indicated by the arrow R, it can be appreciated that the second LEDs 61*b* of the respective LED packages 62*a* and 62*b* are connected in series.

Furthermore, as can be seen from FIG. 6, with the LED packages using two LEDs having the structure as shown in FIG. 5, the LED package-mounting substrate applicable to the LED package having three LEDs can be used without changing the structure. This will provides advantages in manufacturing the products.

As such, in the light source of the present invention, the LEDs emitting the same color and differently positioned in the respective LED packages can be connected in series by the conductive patterns formed on the LED mounting-substrate 64. Accordingly, unlike the conventional light source which has the LEDs emitting the same color arranged in a line, the LEDs emitting the same color can be connected to each other in series, so that power supplied to the LEDs emitting the respective colors can be controlled and, at the same time, the combination of the colors can be effectively performed, thereby generating white light of a high quality having a uniform color tone.

As is apparent from the description, according to the present invention, without being arranged in a line, the LEDs emitting the same color are differently arranged in every LED package, thereby solving the problem of non-uniform combination of the colors according to the positions of the LEDs on the LED package-mounting substrate. Furthermore, a light unit comprising the LED package with a new arrangement, and an LED package-mounting substrate, which can connect the LEDs in the LED package without increasing the width, are provided, thereby realizing miniaturization and reduction in thickness of the display apparatus, such as LCD panels.

It should be understood that the embodiments and the accompanying drawings as described above have been described for illustrative purposes and the present invention is limited only by the following claims. Further, those skilled in the art will appreciate that various modifications, additions and substitutions are allowed without departing from the scope and spirit of the invention as set forth in the accompanying claims.

What is claimed is:

1. A LED package comprising:
   a substrate;
   first, second and third terminals sequentially formed on a first side of the substrate;
   fourth, fifth and sixth terminals sequentially formed on a second side of the substrate opposite to the first side;
   a first LED electrically connected to the first and sixth terminals and disposed at the center of the substrate;
   a second LED electrically connected to the second and third terminals and disposed between the first side and the first LED; and
   a third LED electrically connected to the fourth and fifth terminals and disposed between the second side and the first LED.

2. The LED package as set forth in claim 1, wherein the three LEDs comprise a red LED, a green LED, and a blue LED.

3. A LED package, comprising:
   a substrate;
   a first terminal formed on a first side of the substrate;
   second, third and fourth terminals sequentially formed on a second side of the substrate opposite to the first side;
   a first LED electrically connected to the first and fourth terminals; and
   a second LED electrically connected to the second and third terminals and disposed between the second side and the first LED.

4. The LED package as set forth in claim 3, wherein the two LEDs comprise LEDs generating complementary colors.

5. A light source, comprising:
   a plurality of LED packages, each including:
      a substrate;
      first, second and third terminals sequentially formed on a first side of the substrate;
      fourth, fifth and sixth terminals sequentially formed on a second side opposite to the first side;
      a LED electrically connected to the first and sixth terminals;
      another LED electrically connected to the second and third terminals; and
      a third LED electrically connected to the fourth and fifth terminals, and
   an LED package-mounting substrate, the LED package-mounting substrate mounting the plurality of LED packages in series thereon in a direction of the terminals and being formed with a plurality of terminal contact patterns contacting the terminals of the plurality of LEDs and with a plurality of connecting patterns to connect the terminal contact pattern contacting the first terminal and the fourth terminal of each LED package to the terminal contact pattern contacting the third terminal and the sixth terminal of adjacent LED package, and to connect the terminal contact pattern contacting the second terminal of the LED package to the terminal contact pattern contacting the fifth terminal of another adjacent LED package.

6. A light source as set forth in claim 5, wherein the plurality of LED packages comprises:
   a first LED package including a first LED electrically connected to the first and sixth terminals and disposed at the center of the first LED package, a second LED electrically connected to the second and third terminals and disposed between the first LED and the first side, and a third LED electrically connected to the fourth and fifth terminals and disposed between the first LED and the second side;
   a second LED package mounted on the substrate adjacent to one side of the first LED package, and including a third LED electrically connected to the first and sixth terminals and disposed at the center of the second LED package, a first LED electrically connected to the second and third terminals and disposed between the third LED and the first side, and a second LED electrically connected to the fourth and fifth terminals and disposed between the third LED and the second side; and
   a third LED package mounted on the substrate adjacent the other side of the first LED package, and including a second LED electrically connected to the first and sixth terminals and disposed at the center of the second LED package, a third LED electrically connected to the second and third terminals and disposed between the second LED and the first side, and a first LED electrically connected to the fourth and fifth terminals and disposed between the second LED and the second side,
   the second LED package, the first LED package and the third package being repetitiously mounted on the LED package-mounting substrate in a predetermined order.

7. A light source as set forth in claim 6, wherein the first LED is a red LED, the second LED is a green LED, and the third LED is a blue LED.

8. A light source as set forth in claim 5, wherein the LED package-mounting substrate is an Al PCB.

9. A light source, comprising:
   a plurality of LED packages, each package including:
      a substrate
      a first terminal formed on a first side of the substrate;
      second, third and fourth terminals formed on a second side opposite to the first side;
      a LED electrically connected to the first and fourth terminals; and
      another LED electrically connected to the second and third terminals; and
   an LED package-mounting substrate, the LED package-mounting substrate mounting the plurality of LED packages in series thereon in a direction of the terminals and being formed with a plurality of terminal contact patterns contacting the terminals of the plurality of LEDs and with a plurality of connecting patterns to connect the terminal contact pattern contacting the first terminal of each LED package to the terminal contact pattern contacting the third terminal of adjacent LED package, and to connect the terminal contact pattern contacting the second terminal of the LED package to the terminal contact pattern contacting the fourth terminal of another adjacent LED package.

10. The light source as set forth in claim 9, wherein the plurality of LED packages comprise:
- a first LED package including a first LED electrically connected to the first and fourth terminals and disposed adjacent to the first side of the first LED package, and a second LED electrically connected to the second and third terminals and disposed adjacent to the second side;
- a second LED package mounted on the substrate adjacent to one side of the first LED package, and including a second LED electrically connected to the first and fourth terminals and disposed adjacent to the first side of the first LED package, and a first LED electrically connected to the second and third terminals and disposed adjacent to the second side,
- the first LED package and the second LED package being repetitiously mounted on the LED package-mounting substrate in this order.

11. The light source as set forth in claim 10, wherein the first LED and the second LED are LEDs generating complementary colors.

12. The tight source as set forth in claim 9, wherein LED package-mounting substrate is an Al PCB.

13. The light source as set forth in claim 10, wherein LED package-mounting substrate is an Al PCB.

* * * * *